(12) United States Patent
El-Kareh et al.

(10) Patent No.: US 8,502,280 B2
(45) Date of Patent: Aug. 6, 2013

(54) FIN-JFET

(75) Inventors: Badih El-Kareh, Cedar Park, TX (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 125 days.

(21) Appl. No.: 13/086,246

(22) Filed: Apr. 13, 2011

(65) Prior Publication Data

US 2011/0210379 A1  Sep. 1, 2011

Related U.S. Application Data

(62) Division of application No. 11/942,513, filed on Nov. 19, 2007, now Pat. No. 7,927,938.

(51) Int. Cl.
*H01L 29/66* (2006.01)

(52) U.S. Cl.
USPC .................................. 257/262; 257/E29.265

(58) Field of Classification Search
None
See application file for complete search history.

(56) References Cited

U.S. PATENT DOCUMENTS

| | | |
|---|---|---|
| 4,903,944 A | 2/1990 | Butzen et al. |
| 4,914,491 A | 4/1990 | Vu |
| 5,995,408 A | 11/1999 | Kinney |
| 6,033,957 A | 3/2000 | Burns, Jr. et al. |
| 6,040,210 A | 3/2000 | Burns, Jr. et al. |
| 6,136,689 A | 10/2000 | Farrar |
| 6,163,052 A | 12/2000 | Liu et al. |
| 6,252,284 B1 | 6/2001 | Muller et al. |
| 6,380,629 B1 | 4/2002 | Kim |
| 6,432,829 B2 | 8/2002 | Muller et al. |
| 6,657,252 B2 | 12/2003 | Fried et al. |
| 6,689,650 B2 | 2/2004 | Gambino et al. |
| 6,696,746 B1 | 2/2004 | Farrar et al. |
| 6,717,167 B2 | 4/2004 | Noda |
| 6,744,082 B1 | 6/2004 | Forbes et al. |
| 6,744,477 B2 | 6/2004 | Meersseman |
| 6,798,009 B2 | 9/2004 | Forbes et al. |
| 6,844,253 B2 | 1/2005 | Farrar |
| 6,878,396 B2 | 4/2005 | Farrar et al. |
| 6,958,287 B2 | 10/2005 | Farrar et al. |
| 6,987,289 B2 | 1/2006 | Nowak |
| 6,998,711 B1 | 2/2006 | Farrar |
| 7,015,525 B2 | 3/2006 | Forbes et al. |
| 7,015,559 B2 | 3/2006 | Murphy et al. |
| 7,028,879 B2 | 4/2006 | Farrar et al. |

(Continued)

FOREIGN PATENT DOCUMENTS

| | | |
|---|---|---|
| WO | 0256472 A1 | 1/2002 |
| WO | 2006038030 A1 | 4/2006 |
| WO | 2007069376 A1 | 6/2007 |

OTHER PUBLICATIONS

Choi, Y-K, et al. "FinFET Process Refinements for Improved Mobility and Gate Work Function Engineering," IEDM Digest, pp. 259-262. (2002).

(Continued)

*Primary Examiner* — Benjamin Sandvik
(74) *Attorney, Agent, or Firm* — Brooks, Cameron & Huebsch, PLLC.

(57) ABSTRACT

Methods, devices, and systems integrating Fin-JFETs and Fin-MOSFETs are provided. One method embodiment includes forming at least on Fin-MOSFET on a substrate and forming at least on Fin-JFET on the substrate.

19 Claims, 8 Drawing Sheets

U.S. PATENT DOCUMENTS

| | | | |
|---|---|---|---|
| 7,157,787 | B2 | 1/2007 | Kim et al. |
| 7,163,851 | B2 | 1/2007 | Abadeer et al. |
| 7,211,864 | B2 | 5/2007 | Seliskar |
| 2003/0092244 | A1 | 5/2003 | Oi et al. |
| 2003/0139029 | A1 | 7/2003 | Haba et al. |
| 2004/0036118 | A1* | 2/2004 | Abadeer et al. ............ 257/347 |
| 2005/0009236 | A1 | 1/2005 | Ball |
| 2005/0239254 | A1 | 10/2005 | Chi et al. |
| 2006/0108675 | A1 | 5/2006 | Colgan et al. |
| 2006/0110906 | A1 | 5/2006 | Han |
| 2006/0113680 | A1 | 6/2006 | DiStefano |
| 2006/0121645 | A1 | 6/2006 | Ball |
| 2006/0134829 | A1 | 6/2006 | Rosa et al. |
| 2006/0139643 | A1 | 6/2006 | Chen |
| 2006/0172507 | A1 | 8/2006 | Best et al. |
| 2006/0175667 | A1 | 8/2006 | Tsuchiaki |
| 2006/0197129 | A1 | 9/2006 | Wohlmuth |
| 2007/0008013 | A1 | 1/2007 | Fijany et al. |
| 2007/0040221 | A1 | 2/2007 | Gossner et al. |
| 2007/0048994 | A1 | 3/2007 | Tuttle |
| 2007/0080387 | A1 | 4/2007 | Liu et al. |
| 2007/0080409 | A1 | 4/2007 | Seliskar |
| 2007/0080440 | A1 | 4/2007 | Cheng et al. |
| 2007/0080448 | A1 | 4/2007 | DeMulder et al. |
| 2007/0111419 | A1 | 5/2007 | Doyle et al. |
| 2007/0152313 | A1 | 7/2007 | Periamen et al. |
| 2007/0170360 | A1 | 7/2007 | Gooch et al. |
| 2007/0262793 | A1 | 11/2007 | Kapoor |

OTHER PUBLICATIONS

Choi Y-K, et al. "Nanoscale CMOS Spacer FinFET for the Terabit Era," Electron Device Letters, vol. 23, No. 1, pp. 25-27. (2002).
Choi Y-K, et al. "Sub-20nm CMOS FinFET Technologies," IEDM Digest, pp. 421-424. (2001).
Fried, David M., et al. "Improved independent Gate N-Type FinFET Fabrication and Characterization," Electron Dev. Lett., vol. 24, No. 9, pp. 592-594. (2003).
Ha, Daewon, et al. "Molybdenum-Gate HfO2 CMOS FinFET Technology," IEDM Digest, pp. 643-646. (2004).
Hergenrother, J.M., et al. "The Vertical Replacement-Gate (VRG) MOSFET: A 50-nm Vertical MOSFET with Ligthography-Independent Gate Length," IEDM Digest, pp. 75-78. (1999).
Hieda, K., et al. "New effects of trench isolated transistor using side-wall gates," IEDM Digest, pp. 736-740. (1987).
Hisamoto D., et al. "A fully developed lean-channel Transistor (DELTA)—A novel vertical ultra-thin SOI MOSFET," IEDM Digest, pp. 833-836. (1989).
Hisamoto D., et al. "A Folded-channel MOSFET for Deep-sub-tenth Micron Era," IEDM Digest, pp. 1032-1034. (1998).
Hisamoto D., et al. "FinFET—A Self-Aligned Double-Gate MOSFET Scalable to 20 nm," Trans. Electron. Dev., vol. 47, No. 12, pp. 2320-2325. (2000).
Huang X., et al. Sub-50 nm P-Channel FinFET, Trans. Electron Dev., vol. 48, No. 5, pp. 880-886. (2001).
Kedzierski, Jakub, et al. "Metal-gate FinFET and fully depleted SOI devices using total gate silicidation," IEDM Technical Digest, pp. 247-250. (2002).
Kedzierski, Jakub, et al. "Extension and Source/Drain Design for High-Performance FinFET Devices," Trans. Electron Dev., vol. 50, No. 4, pp. 952-958. (2003).
Kim, Seung-Hwan, et al. "Bulk Inversion in FinFETs and Implied Insights on Effective Gate Width," Trans. Electron Dev., vol. 52, No. 9, pp. 1993-1997. (2005).
Lee, C.H., et al. "Novel body Tied FinFet Cell Array Transistor DRAM with Negative Word Line Operation . . . ," 2004 Symposium on VLSI Technical Digest, pp. 130-131. (2004).
Lim, Y. F., et al. "Random Telegraph Signal Noise in Gate-All-Around Si-FinFET with Ultranarrow Body," Electron Dev. Lett., vol. 27, No. 9, pp. 765-768. (2006.
Lin, Horng-Chin, et al. "High-Performance P-Channel Schottky-Barrier SOI FinFET . . . ," Electron Dev. Lett., vol. 24, No. 3, pp. 102-104. (2003).
Lindert, Nick, et al. "Sub-60nm Quasi-Planar FinFETs Fabricated Using a Simplified Process," Electron Dev. Lett., vol. 22, No. 10, pp. 487-489. (2001).
Liu, Y. X., et al. "Flexible Threshold Voltage FinFETs with Independent Double Gates and an Ideal Rectangular Cross-Section . . . ," IEDM Tech. Digest, pp. 986-988. (2003).
Raskin, Jean-Pierre, et al. "Analog/RF Performance of Multiple Gate SOI Devices: Wideband Simulations . . . ," Trans. Electron Dev., vol. 53, No. 5, pp. 1088-1095. (2006).
Takato, H., et al. "High Performance CMOS Surrounding Gate Transistor (SGT) for Ultra High Density LSIs," IEDM Tech. Digest, pp. 222-225. (1988).
Tan, Kian-Ming, et al. "Drive-Current Enhancement in FinFETs Using Gate-Induced Stress," Electron Dev. Lett., vol. 27, No. 9, pp. 769-771. (2006).
Tsui, Byung-Yue, et al. "Process and Characteristics of Modified Schottky Barrier (MSB) p-Channel FinFETs," Trans. Electron Dev.,vol. 52, No. 11, pp. 2455-2462. (2005).
Wu, Xusheng, et al. "A Three-Dimensional Stacked Fin-CMOS Technology for High-Density ULSI Circuits," Trans. Electron Dev., vol. 52, No. 9, pp. 1998-2003. (2005).
Xuan, Peiqi, et al. "FinFET SONOS Flash Memory for Embedded Applications," IEDM Tech. Digest, pp. 609-612. (2003).
Yang, Fu-Liang, et al. "25 nm CMOS Omega FETs," IEDM Tech. Digest, pp. 255-258. (2002).
Yu, Bin, et al. "FinFET Scaling to 10 nm Gate Length," IEDM Tech. Digest, pp. 251-254. (2002).
Zhang, Weimin, et al. "The ITFET: A Novel FinFET-based Hybrid Device," Trans. Electron Dev., vol. 53, No. 9, pp. 2335-2343. (2006).
International Search Report and Written Opinion for related PCT Application Serial No. PCT/US2008/012176, mailed Jun. 23, 2009 (10 pgs.).
Notice of Preliminary Rejection for related Korean Patent Application No. 10-2010-7013660 dated Oct. 27, 2011 (15 pp.).
European Search Report for related PCT Application No. PCT/US2008012176, mailed Aug. 24, 2012, (7 pgs).

* cited by examiner

FIN-JFET

PRIORITY APPLICATION INFORMATION

This application is divisional of U.S. application Ser. No. 11/942,513, filed Nov. 19, 2007, the specifications of which are incorporated herein by reference.

BACKGROUND

A continuing challenge of achieving nanoscale integration in the semiconductor industry is to fabricate an ever-increasing number of devices, e.g., transistors, into an ever-decreasing area by shrinking device footprint, while retaining high yields and reliability. This has been achieved for digital applications mainly by scaling down transistor channel lengths while managing associated short-channel effects, e.g., a decrease of threshold voltage (Vt) due to charge sharing between the gate and source/drain diffusion regions. This has lead to reduced-thickness gate insulator, e.g., oxide, layers, increased channel-doping concentrations, and use of various three-dimensional structure construction techniques.

In previous approaches, transistors have been fabricated in a horizontal plane. One previous approach to address the above-mentioned nanoscale challenge is to construct transistors on a vertical plane, essentially orienting them on edge to reduce the real estate required per transistor in the horizontal plane, for example, forming field-effect transistors (FETs) on a thin vertical semiconductor layer, e.g., silicon (Si) provided in a thin wall-like fashion, e.g., a Fin, having a thin insulating film. Multiple gates can be formed, e.g., one on each of two sides, of the free-standing, vertically-oriented Fin, with the gates being electrically connected to cooperatively modulate the channel therebetween. FETs formed on these Fin-like structures are referred to as Fin-FETs or multi-gate FET structures (MuGFETs).

The fundamental configuration of a metal-oxide-semiconductor (MOS) FET, i.e., MOSFET, and a junction FET, i.e., JFET, are well known. A MOSFET gate controls current by application of a voltage to the gate, causing a field effect in the surface of the semiconductor, and either a buildup or depletion of charge in the wafer surface under the gate, depending on the doping conductivity type in the wafer under the gate and the polarity of the gate voltage. This buildup or depletion of charge creates an electrically-conducting channel under the gate, which connects a source region to a drain region. An n-channel MOS transistor, i.e., NMOS, has n-type source and drain regions formed in a p-type wafer. When a positive gate-source voltage, $V_{GS}$, is applied, an n-channel is created at the surface of the p-type region, just under the insulating layer, by depleting the channel region of holes and attracting electrons to the surface. Conversely, a p-channel MOS transistor, i.e., PMOS, has p-type source and drain regions formed in an n-type body. A p-channel is created at the surface of the n-type channel region when a negative gate to source voltage, e.g., $V_{GS}$, is applied, depleting the channel region of electrons and attracting holes to the surface.

A JFET configuration has a junction formed under a gate conductor. As is the case with MOSFETs, JFETS can be formed having an n-channel, i.e., nJFET, or p-channel, i.e., pJFET. Furthermore, JFETS can be fabricated to operate as a depletion mode device (normally-on and conducting at zero gate voltage, turned-off by applying a reverse bias voltage on the gate having a magnitude in the range of approximately 1.2 Volts to 1.8 Volts, negative for an nJFET and positive for a pJFET) or an enhancement mode device (normally-off at zero gate voltage, turned-on by application of a small forward bias voltage on the gate, positive for an nJFET and negative for a pJFET).

Rather than an insulated gate, a field is applied by the junction acting as a gate. During operation, e.g., of an nJFET, current flows from the source to the drain in a doped silicon region under the gate. As the nJFET gate voltage is increased, a region depleted of charge (the depletion region) spreads, pinching-off the conducting path. Due to the lack of available mobile charge, the depleted region behaves like an insulator, and thus has the effect of pinching-off, i.e., restricting, current as it increases in depth. An nJFET can operate opposite from an enhancement-mode MOSFET. In an enhancement-mode nMOSFET, increasing the gate voltage increases current through the channel. However, in an nJFET, increasing the gate voltage decreases current through the channel.

Complementary MOS logic, i.e., CMOS, uses p- and n-channel MOSFETs as building blocks. In an inverter, each n-type MOSFET, i.e., nMOSFET, is complemented with a p-type MOSFET, i.e., pMOSFET, by connecting both gates and drains together. A high voltage on the gates will cause the nMOSFET to conduct and the pMOSFET not to conduct. A low voltage on the gate causes the reverse conductivity. MOSFETs are used primarily in digital, memory, and analog circuit applications. However, JFETs are known to better meet analog requirements calling for analog components having high signal-to-noise ratio, low parameter mismatch, linearity, and low flicker noise.

The development of Fin-MOSFETs to date has emphasized performance and density for low voltage digital and memory applications. In particular, a focus has been placed on the reduction of short-channel effect, sub-threshold slope (associated with reduced threshold voltage and inability to completely turn-off a transistor), and effective area for a given channel width. Several non-planar structures have been demonstrated in previous approaches of forming Fin-MOSFETS. Initially, the MOSFET channel was formed on a silicon trench sidewall. Thereafter, a "surround-gate" vertical MOSFET was constructed using a directional etch technique to form a silicon pillar, with the pillar surrounded by a dielectric and having a source on the top of the pillar, a drain on the bottom, and a gate in between. In another previous approach, a lateral Fin-MOSFET was demonstrated using a silicon-on-insulator (SOI) configuration, whereby the SOI was formed by lateral oxidation under a single-crystal silicon pillar, thus separating the pillar from the supporting wafer, with a source, channel, and drain being formed along the Fin. Other variants of Fin-MOSFET structures have been fabricated with varying degrees of performance and complexity.

DETAILED DESCRIPTION

Methods, devices, and systems for integrating Fin-JFETs and Fin-MOSFETs are provided. One method embodiment includes forming at least one Fin-MOSFET on a substrate and forming at least one Fin-JFET on the substrate. One having ordinary skill in the art will recognize the benefits associated with using a three-dimensional design in fabricating both Fin-MOSFETs and Fin-JFETs on the same die, as set forth in the present disclosure, including the integration of digital and improved analog capabilities. Additionally, the reader will appreciate the manufacturing advantages associated with fabricating Fin-JFETs and Fin-MOSFETs to similar elevations, e.g., height, as presently disclosed, with Fin-JFET structures being more substantial in the other dimensions, e.g., width and length, than Fin-MOSFETs to operate at analog voltage ranges.

As used herein, "Fin-FET" can refer to either or both of a Fin-MOSFET and/or a Fin-JFET. The term "Fin-FET" has previously been used interchangeably as shorthand terminology for "Fin-MOSFET," denoting a single variety of Fin structure devices, e.g., a Fin-MOSFET. The present disclosure, however, includes another type of FET having a Fin structure, e.g., Fin-JFET, as used herein, the term "Fin-FET" is expanded to generically refer to a Fin-MOSFET, a Fin-JFET, Fin-MESFET (Metal-Semiconductor-FET which have a metal-semiconductor Schottky-barrier junction in place of a pn junction, and behave similar to a JFET), and/or any other FET fabricated having a Fin structure.

While certain embodiments of the present invention are described herein, for example embodiments including one or more normally-on, e.g., depletion mode, nJFET and/or pJFET; embodiments of the present invention are not so limited, and may include normally-off, e.g., enhancement mode, JFETs as well. Furthermore, embodiments of the present invention may include normally-on and normally-off MESFETs, of both polarities, implemented having a fin structure. Embodiments of the present invention are not limited to FETs fabricated with particular materials, such as silicon and gallium-arsenide (GaAs) for example.

Hereinafter, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. As used herein, the term "substrate" or "substrate assembly" may include a number of semiconductor-based structures that have an exposed semiconductor surface. The semiconductor need not be silicon-based. For example, the semiconductor can be silicon-germanium, germanium, or gallium-arsenide, among others. When reference is made to "substrate" in the following description, previous process steps may have been utilized to form regions or junctions in or on the semiconductor structure and/or foundation.

As used herein, "layer" can refer to a layer formed on a substrate using a deposition, growth, or other material build-up process. The term "layer" is meant to include layers specific to the semiconductor industry, such as "barrier layer," "dielectric layer," and "conductive layer." The term "layer" is also meant to include layers found in technology outside of semiconductor technology, such as coatings on glass. As used herein, "terminal" can generically refer to a source, drain, gate, or body of a Fin-FET, e.g., Fin-JFET or Fin-MOSFET.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

In the figures, the first digit of a reference number refers to the Figure in which it is used, while the remaining two digits of the reference number refer to the same or equivalent parts of embodiment(s) of the present disclosure used throughout the several figures. The scaling of the figures does not represent precise dimensions and/or dimensional ratios of the various elements illustrated herein.

According to one or more embodiments of the present disclosure, at least one flexible voltage Fin-JFET, e.g., nJFET and/or pJFET, e.g., for digital or analog applications, is fabricated together in integrated circuitry with at least one Fin-MOSFET, NMOS and/or PMOS, e.g., in digital CMOS configurations. Integrating Fin-MOSFETs) and Fin-JFET(s) support a wide variety of applications, mixed-signal designs for example, having analog and digital circuits fabricated together by the same process steps with reduced additional complexity (unlike previous mixed-signal design approaches having JFETs implemented using planar CMOS, e.g., MOSFETs fabricated in the horizontal plane without Fin structures). According to embodiments of the present disclosure, a three-dimensional JFET having a channel not in the plane parallel to the substrate, e.g., Fin-JFETs, compatible with a three-dimension MOSFET, having a channel not in the plane parallel to the substrate e.g., Fin-MOSFETs, are integrated together with relatively few numbers, e.g., 2-3, of additional fabrication steps.

The accuracy of an analog circuit, whose function is based on proportionality, can depend on the precision of the relationship between an input signal and an output signal; therefore, the analog circuit can be vulnerable to noise. Integrated circuits that combine analog and digital transistor circuitry on a single chip to save space can include measures for isolating the analog circuits from the digital circuits at the chip level. Such features are not shown herein so as not to obfuscate aspects of the present disclosure.

MOSFET scaling can reduce area used, leading to reduced cost. Smaller MOSFETs can be packed more densely, resulting in either smaller chips or chips with more computing power per unit area. Cost per integrated circuit can be related to the number of chips that can be produced per wafer. Hence, smaller integrated circuits can allow more chips per wafer, reducing the price per chip.

As transistors become smaller, the number of atoms in the silicon that produce many of the transistor's properties are reduced. During chip manufacturing, random process variation can affect the size of the transistor, such variations becoming a greater percentage of the overall transistor size as the transistor shrinks. Thus, transistor characteristics can become less deterministic, but more statistical, and the statistical variation can increase design difficulty.

Fin-MOSFETs, having vertical channels as well as horizontal channels, implemented on bulk silicon and SOI are known by those having ordinary skill in the art. One of the drawbacks of these three-dimensional Fin structures, e.g., vertical Fin structures, is the increased variation in topography. Widely variable topography can complicate the fabrication process, e.g., making it more difficult to form contacts on structures of various heights. According to one or more embodiments of the present disclosure, a method is provided for reducing the topography of Fin-FET devices.

Figure 1A:
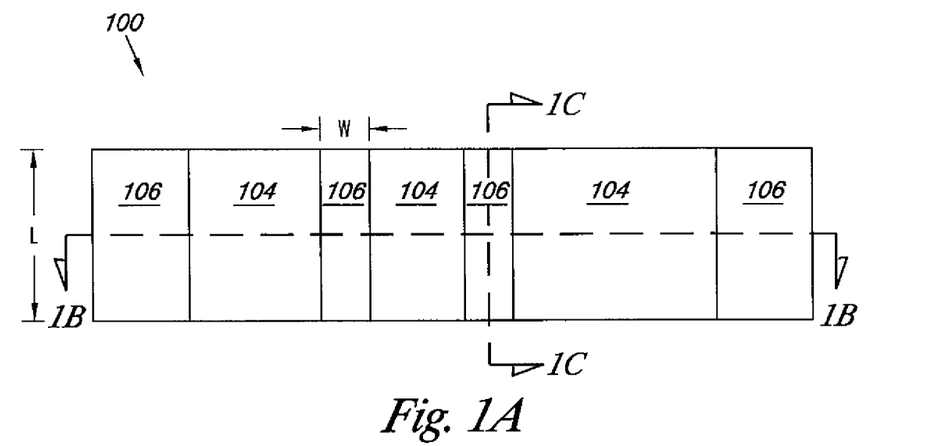
FIG. 1A illustrates a top view of Fin-MOSFET structures at a particular point in a semiconductor fabrication process according to one or more embodiments of the present disclosure.
Figure 1B:
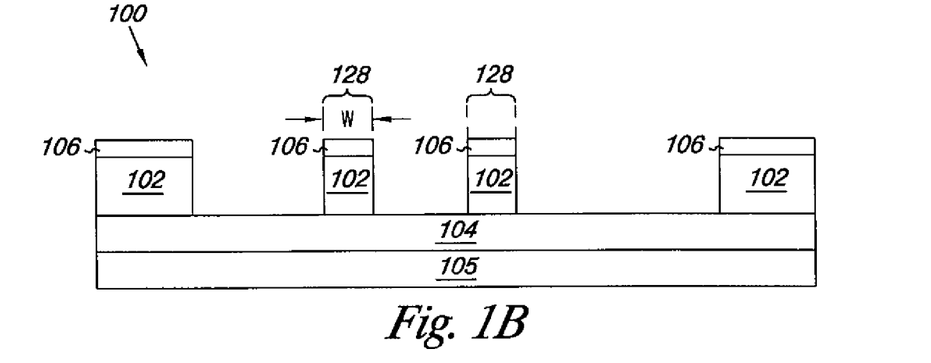
FIG. 1B illustrates a cross-sectional view of the Fin-MOSFET structures at the particular point in a semiconductor fabrication process illustrated in FIG. 1A, taken along cut line 1B-1B, according to one or more embodiments of the present disclosure.
Figure 1C:
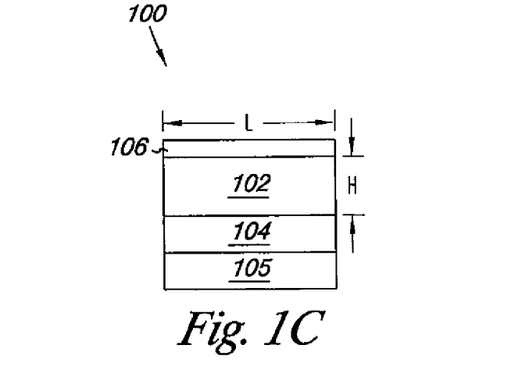
FIG. 1C illustrates a cross-sectional view of the Fin-MOSFET structures at the particular point in a semiconductor fabrication process illustrated in FIG. 1A, taken along cut line 1C-1C, according to one or more embodiments of the present disclosure.

FIG. 1A-1C illustrate several views of an integrated circuit 100 with Fin-MOSFET structures 128 at a particular point in a semiconductor fabrication process according to one or more embodiments of the present disclosure. The figures are not drawn to scale. FIG. 1A illustrates a top view, FIG. 1B illustrates a cross-sectional view taken along cut line 1B-1B, and FIG. 1C illustrates a cross-sectional view taken along cut line 1C-1C. While double gate Fin-MOSFET structures, for example, are described herein and shown in the following figures, embodiments of the present disclosure are not so limited. Aspects of one or more embodiments of the present disclosure shown and/or described herein are applicable to other multi-gate configurations, e.g., tri-gate configurations.

As shown in one or more of FIGS. 1A-1C, one or more embodiments of the present disclosure include a silicon (Si) layer 102, e.g., SOI layer, formed over a base insulator layer 104, e.g., a base oxide (BOX), and a thick insulator layer 106, e.g., dielectric, formed over the silicon layer 102. In one or more embodiments, the thick insulator layer 106 is formed to a thickness of about 1,000 Angstroms; however, embodiments are not so limited. As shown, the Fin-MOSFET structures, e.g., 128, are separated from a semiconductor substrate 105, e.g. a bulk silicon wafer, by the base insulator layer 104. The silicon layer 102 and insulator layer 104 can be deposited or built-up by some other method on the respective underlying layer, for example by thermally oxidizing one wafer, then bonding another wafer thereto as is known for forming SOI wafers. In one or more embodiments, the insulator layer 104 can be formed to a depth of approximately 145 nm. In one or more embodiments, the silicon layer 102 can be formed over the insulator layer 104. The thick insulator layer 106 functions as a mask for patterning in formation of the Fin structure 128. This mask can be formed, for example, of a thin layer of silicon dioxide ($SiO_2$) and a thin layer of silicon nitride ($Si_3N_4$), the layers constituting the thick insulator layer 106 not being individually shown in FIGS. 1A-1C, as the technique is well known in the art.

As the reader will appreciate, the Fin-FET devices being fabricated can be configured either intrinsic, p-type, or n-type Fin-FET devices, depending on choice of doping. As the reader will appreciate, the thick insulator layer 106 can be formed from materials such as silicon dioxide ($SiO_2$), silicon nitrides ($SiN/Si_2N/Si_3N_4$), silicon oxynitrides ($SiO_xN_y$), or other dielectric materials.

Openings in the silicon layer 102 covered by the thick insulator layer 106 are masked and etched, patterning semiconductor Fins of a particular width (W), height, (H), length (L), and orientation using photolithographic techniques. For example, a portion of the oxide and nitride mask layers, described above, can be removed, leaving portions of the mask which will define the Fin structures 128. As is shown in FIGS. 1A and 1B, a portion of the oxide and nitride mask layers have been removed, e.g., by reactive ion etching (RIE), to define the locations of the Fin structures, e.g., 128. In various embodiments, this process step is used to determine the location and size of the Fin structures on the base insulator layer 104, for example a pair of Fin-MOSFET structures which can be completed into a CMOS device, e.g., associated with the two complementary transistors in a CMOS device, one being a p-channel transistor and the other being an n-channel transistor. According to one or more embodiments, a single Fin-MOSFET structure is shown formed on the base insulator layer in FIGS. 1A-1L. In some embodiments, other lithography and etching techniques are used to form appropriate Fin structures, as are understood by those having ordinary skill in the art.

Figure 1D:
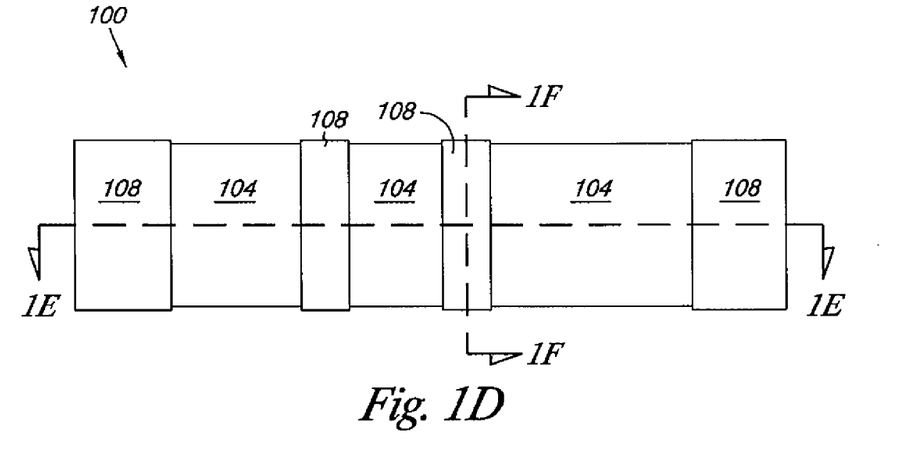
FIG. 1D illustrates a top view of Fin-MOSFET structures at another particular point in a semiconductor fabrication process according to one or more embodiments of the present disclosure.
Figure 1E:
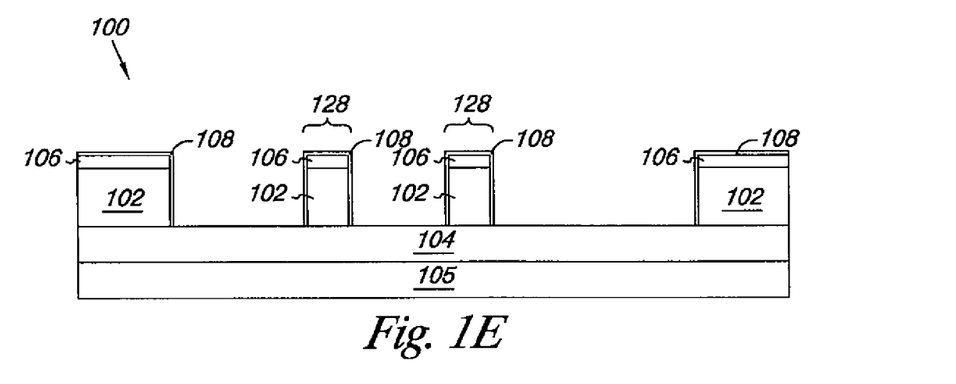
FIG. 1E illustrates a cross-sectional view of the Fin-MOSFET structures at the particular point in a semiconductor fabrication process illustrated in FIG. 1D, taken along cut line 1E-1E, according to one or more embodiments of the present disclosure.
Figure 1F:
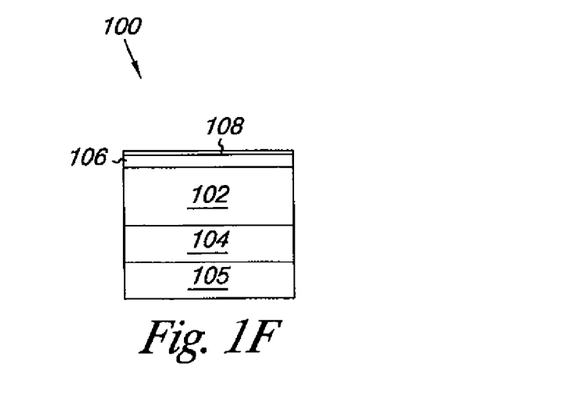
FIG. 1F illustrates a cross-sectional view of the Fin-MOSFET structures at the particular point in a semiconductor fabrication process illustrated in FIG. 1D, taken along cut line 1F-1F, according to one or more embodiments of the present disclosure.
Figure 1G:
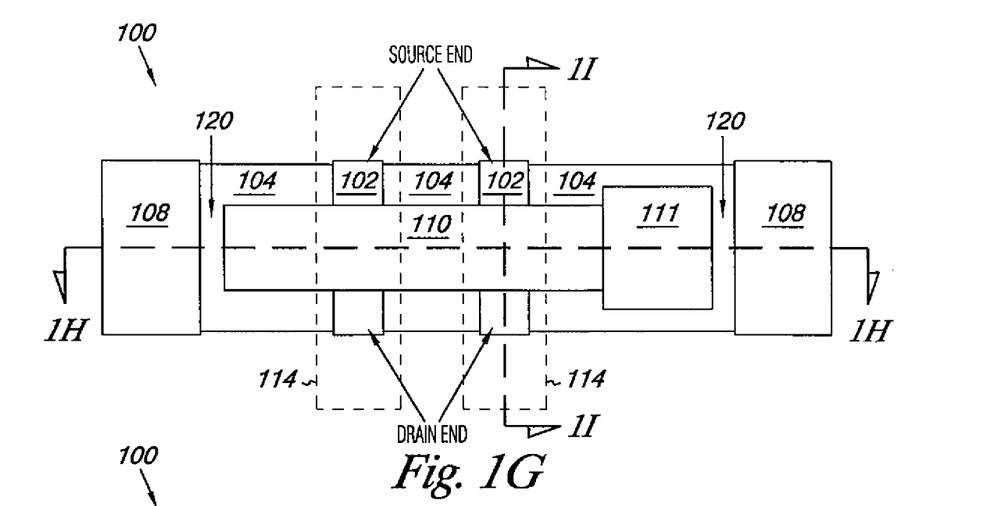
FIG. 1G illustrates a top view of Fin-MOSFET structures at a third particular point in a semiconductor fabrication process according to one or more embodiments of the present disclosure.
Figure 1H:
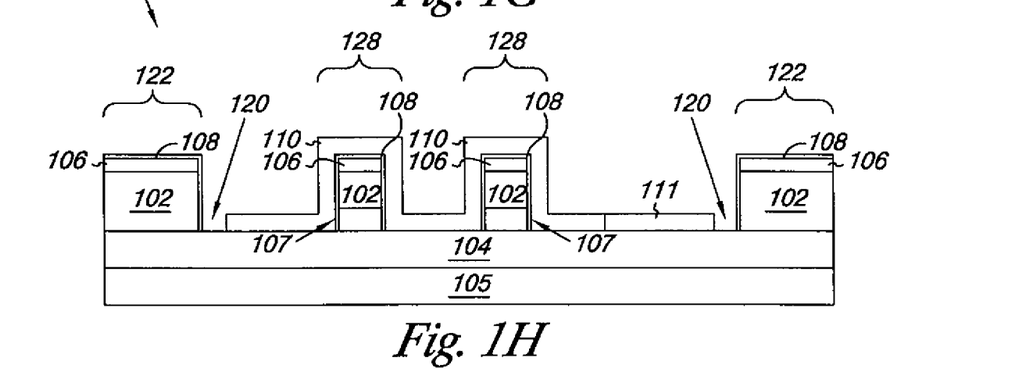
FIG. 1H illustrates a cross-sectional view of the Fin-MOSFET structures at the particular point in a semiconductor fabrication process illustrated in FIG. 1G, taken along cut line 1H-1H, according to one or more embodiments of the present disclosure.

Some Fin structures, or portions of Fin-MOSFET devices, e.g., gate conductor, may abut isolations, e.g., between devices, chip regions, and/or bulk semiconductor such as 122 as shown in FIG. 1H. According to one or more particular embodiments, each Fin may have a width (W) thin enough to be fully depleted by a wrap-around gate (not shown in FIGS. 1A-1C, but which can be formed by later processing). As one skilled in the art will appreciate, the SOI silicon 102 portion of the Fin structure 128 functions as the channel region for current flow when the completed Fin-MOSFET device is "on." According to one or more particular embodiments, each Fin may have a length (L) and a height (H) of approximately that typical known for MOSFET fin structures; however, embodiments of the present disclosure are not limited to particular dimensions. FIGS. 1B and 1C show the orientation of width (W), length (L), and height (H) dimensions.

Two fins are shown in the FIGS. 1A-1C, arranged parallel to one another; however, embodiments of the present disclosure are not so limited. The structure can be extended to include additional gates in the vertical and/or horizontal directions. According to one or more embodiments, a channel region, extending across the length (L) on respective fins, can be lightly doped, e.g., $10^{15}$ atoms/cm$^3$.

FIGS. 1D-1F illustrate several views of an integrated circuit 100 with Fin-MOSFET structures, e.g., 128, at another particular point in a semiconductor fabrication process according to one or more embodiments of the present disclosure. FIG. 1D illustrates a top view, FIG. 1E illustrates a cross-sectional view taken along cut line 1E-1E, and FIG. 1F illustrates a cross-sectional view taken along cut line 1F-1F. Following formation of the Fin-MOSFET structures 128, a gate dielectric 108 of appropriate dielectric constant is grown or deposited over the remaining thick insulator layer 106 and silicon layer 102 of the Fin-MOSFET structures, e.g., the SOI portion 102 of structure 128 shown in FIG. 1B, including a layer above and at least a thin layer on sidewall areas as is shown in FIGS. 1D-1F. In one or more embodiments, the gate dielectric 108 is formed to a thickness much less than that of the thick insulator layer 106; however, embodiments of the present invention are not limited to particular proportions. The figures are not drawn to scale, nor to relative proportionality, for clarity in illustrating particular features of embodiments of the present invention. For example, the scale of the gate dielectric 108 illustrated in the figures may be exaggerated with respect to the dimensions shown for the thick insulator layer 106, which may actually be one or more orders of magnitude thicker than the gate dielectric 108. In one or more embodiments, the gate dielectric layer 108 can be made of silicon dioxide ($SiO_2$).

Figure 1I:
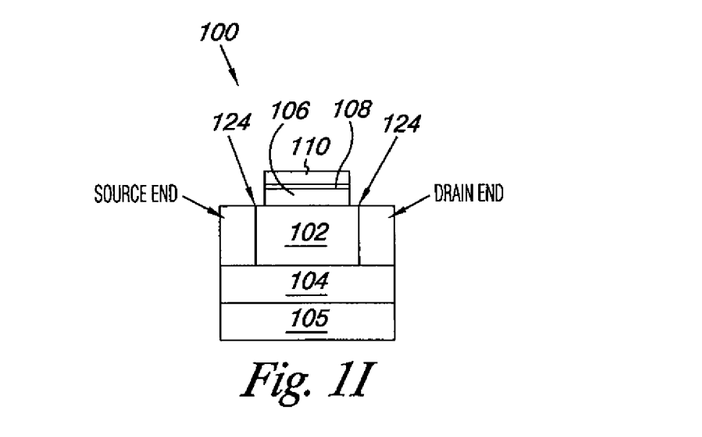
FIG. 1I illustrates a cross-sectional view of the Fin-MOSFET structures at the particular point in a semiconductor fabrication process illustrated in FIG. 1G, taken along cut line 1I-1I, according to one or more embodiments of the present disclosure.

FIGS. 1G-1I illustrate several views of an integrated circuit 100 with Fin-MOSFET structures, e.g., 128, at another particular point in a semiconductor fabrication process according to one or more embodiments of the present disclosure. FIG. 1G illustrates a top view, FIG. 1H illustrates a cross-sectional view taken along cut line 1H-1H, and FIG. 1I illustrates a cross-sectional view taken along cut line 1I-1I.

In various embodiments, a gate is formed over the gate dielectric layer 108. A conductive layer 110, e.g., gate conductor, is deposited over portions of the base insulator layer 104 and Fin structures, e.g., Fin structures 128 shown in FIG. 1E, so that portions of the outer surface of the gate dielectric layer 108 is covered by the gate material, e.g., conductive layer 110. The conductive layer 110 is subsequently patterned, and includes a gate contact landing pad portion 111 upon which a gate connection can be formed in further processing steps. According to one or more embodiments of the present disclosure, the width (W in FIGS. 1A-1C) of the Fin structures 128 is typically thin. For example, the Fin structures 128 may be dimensioned such that the width is much smaller than either of the height or length dimensions.

One having ordinary skill in the art will appreciate that sufficient room has been allowed between Fin structures, e.g., 128, and surrounding silicon isolation, e.g., structure 122, so that the gate contact landing pad portion 111 can be recessed to an elevation at which a gate contact formed thereon will have a top surface that is quasi-planar with Fin structure, e.g. 128, elevation. Quasi-planar connotes a topography that is not precisely planar, but has the magnitude of its associated peaks and valleys processed so as to mitigate differences therebetween. As shown in FIG. 1H, the gate contact landing pad portion 111 is sufficiently recessed below Fin structure, e.g. 128, elevation to permit formation of a gate contact thereon having a thickness that can be partially, or wholly, offset by a portion of the Fin structure, e.g., 128, height. According to one or more embodiments, the conductor layer 110 and landing pad portion 111 are formed of the same material, which can be metallic, fully-silicided polysilicon ("FUSI"), or doped polysilicon ("POLY"), among others, of appropriate type, e.g., n-type or p-type.

Although the conductive layer may be described herein in reference to "a gate," i.e., singular gate, and shown in FIGS. 1G and 1H as being electrically connected and formed on opposing sidewalls 107 of a respective Fin structure 128, one of ordinary skill in the art will appreciate that separately-formed, and optionally independently operable, multiple gates can be formed on the vertical surfaces of the Fin structure 128, e.g., a first (front) gate and a second (back) gate formed on opposite sidewalls 107, or a tri-gate device, etc. A multiple gate device facilitates more current flow through the device by controlling additional channel regions.

One having ordinary skill in the art will appreciate spaces, e.g., gaps 120, between the gate conductor, e.g., conductive layer 110 with gate contact landing pad area 111, and semiconductor opening boundaries, which can be maintained at minimum dimensions, i.e., kept as small as possible while still maintaining isolation therebetween. These gaps 120 can be filled-in with spacer filler, e.g., spacer oxide, at another point in the fabrication process. For example, the gaps 120 between the conductive layer, e.g., gate conductor 110 and/or, and the surrounding silicon isolation, e.g., structure 122, can be fabricated to minimum dimensions according to one of more embodiments. In another example, minimum space 124 can be left between conductive layer 110, e.g., gate conductor, and source and drain contact pad locations (see source and drain contact pad footprint 126 locations in FIGS. 1J and 1L for example) according to one of more embodiments.

As shown in FIG. 1H, a source and a drain are configured such that current can flow therebetween in the Fin structure 128, e.g., in the sidewalls 107 of the silicon layer 102 of the Fin structure 128, when the respective Fin-MOSFET device is "on." For example, current can flow perpendicular to the plane of the drawing sheet in FIG. 1H. One having ordinary skill in the art will appreciate that several techniques are available to form source and drain contact extensions (not shown), before, or after, spacer formation. Source and drain regions are defined on the planar top silicon, e.g., into SOI 102 as shown in FIGS. 1G and 1I, by implanting, appropriate doping, or by Schottky barrier formation, for example. While one source and drain orientation is illustrated in FIGS. 1G and 1I, embodiments of the invention are not so limited, e.g., the source and drain regions may be opposite those shown in FIGS. 1G and 1I. Doping of source and drain regions, and extensions, can be performed by techniques known to those having ordinary skill in the art, e.g., pulsed plasma doping (PLAD). Source and drain implant windows are indicated at 114 in FIG. 1G associated with a corresponding Fin structure, the implant windows generally indicating areas exposed to doping (other areas being appropriately masked to prevent doping). As will be understood by those having ordinary skill in the art, the precise mask pattern of an implant window for a particular doping technique may be the same, or different, than that generally illustrated in FIG. 1G by implant window 114.

The respective source and drain extensions (not shown) are formed by lightly doping an area below the surface of the exposed respective source and drain region using masking and photolithographic techniques. Once the source and drain extensions around the source and drain regions have been completed, the source and drain regions can be implanted using appropriate dopants (see following dopant discussion for additional details) at known concentrations for each respective region. Once the source and drain is implanted, the source and drain can be annealed to drive the dopants into the source and drain. In some embodiments, the source and drain can be annealed at approximately 1000° C. for approximately 5 seconds. After the source and drain are formed, the Fin-MOSFET structures 128 can be processed with additional CMOS process steps. Multiple gate, and source and drain regions can also be formed along the Fin structures, e.g., 128, in the vertical direction.

In efficiently fabricating different type Fin-MOSFETS and Fin-JFETS (discussed later), on the same die, some doping processes may be performed concurrently for particular Fin-FET devices. For example, an appropriate n-type profile is used in forming the source and drain regions of an n-channel Fin-MOSFET and/or an n-channel Fin-JFET. Typically, an n-type dopant such as Arsenic (As) is used for these purposes; however, embodiments of the present invention are not so limited. Conversely, a p-type profile, e.g., typically Boron (B), is used in forming the source and drain regions of a p-channel Fin-MOSFET and/or a p-channel Fin-JFET. Again, embodiments of the present invention are not so limited to a particular dopant. N-type conductive material, e.g., doped polysilicon, is used in forming an n-channel Fin-MOSFET gate, and/or a gate over the pn junction of a p-channel Fin-JFET is treated with an n-type profile, e.g., typically Arsenic (As). P-type conductive material, e.g., doped polysilicon, is used in forming a p-channel Fin-MOSFET gate, and/or a gate over the pn junction of an n-channel Fin-JFET is treated with a p-type profile, e.g., typically Boron (B). One skilled in the art will appreciate the manner in which similar doping profiles may be applied to the different Fin-FET structures concurrently using common masking, patterning and doping processes. This is discussed further below with respect to fabrication of a Fin-JFET.

Figure 1J:
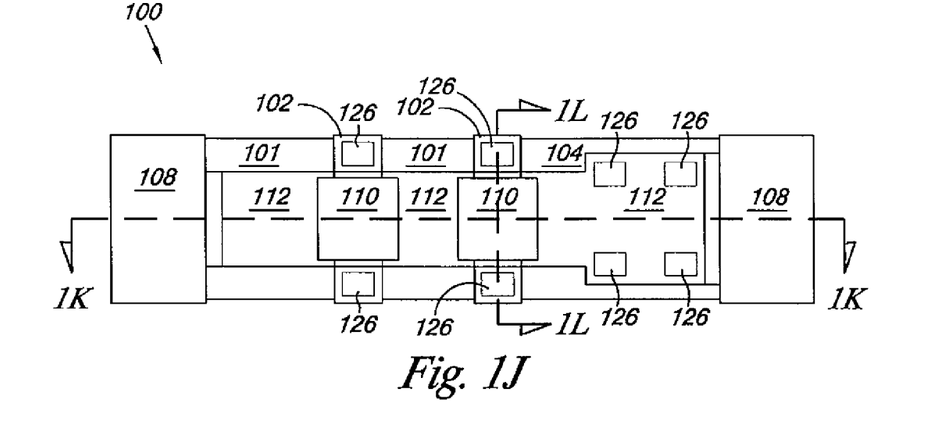
FIG. 1J illustrates a top view of Fin-MOSFET structures at a fourth particular point in a semiconductor fabrication process according to one or more embodiments of the present disclosure.
Figure 1K:
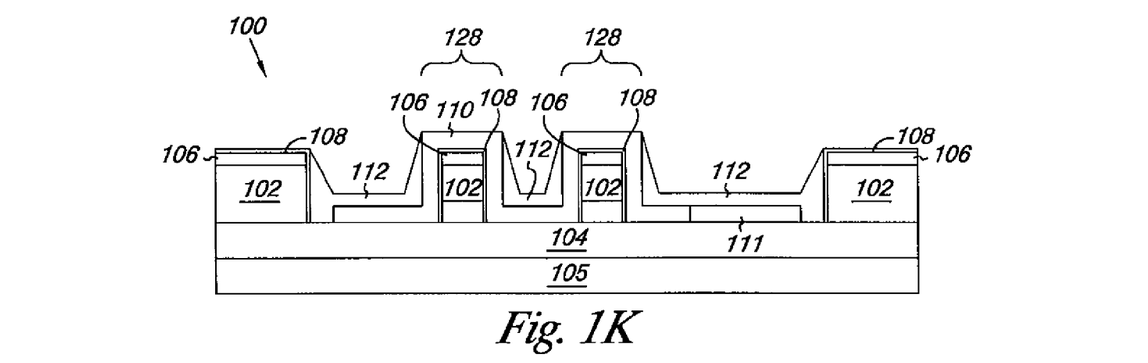
FIG. 1K illustrates a cross-sectional view of the Fin-MOSFET structures at the particular point in a semiconductor fabrication process illustrated in FIG. 1J, taken along cut line 1K-1K, according to one or more embodiments of the present disclosure.
Figure 1L:
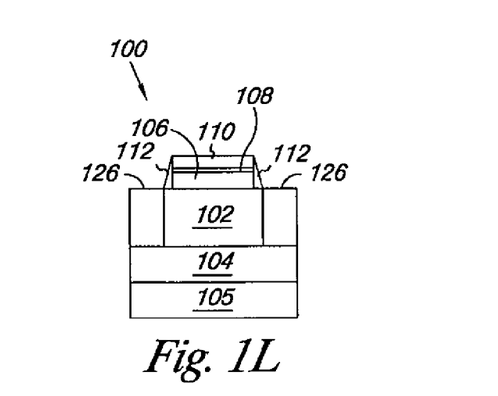
FIG. 1L illustrates a cross-sectional view of the Fin-MOSFET structures at the particular point in a semiconductor fabrication process illustrated in FIG. 1J, taken along cut line 1L-1L, according to one or more embodiments of the present disclosure.

FIGS. 1J-1L illustrate several views of an integrated circuit 100 with Fin-MOSFET structures, e.g., 128, at another particular point in a semiconductor fabrication process according to one or more embodiments of the present disclosure. FIG. 1J illustrates a top view, FIG. 1K illustrates a cross-sectional view taken along cut line 1K-1K, and FIG. 1L illustrates a cross-sectional view taken along cut line 1L-1L. Contact pad footprints 126 are located on the Fin-MOSFET structures 128, for respective source and drain metallization connections, e.g., by via. Additionally, at least one, and preferably a plurality, of contact pad footprints 126 are located on the gate contact landing pad area 111. A spacer dielectric 112 is deposited, masked and etched to form the embodiment illustrated in FIGS. 1J-1L.

The gaps 120 shown in FIGS. 1G and 1H, between the conducting layer 110 or gate contact landing pad area 111, and surrounding silicon isolation structures 122, are filled with the spacer dielectric 112 to increase planarity of the resulting topography. Depending on the relative height between a Fin structure 128 and the conductive layer 110 (including gate contact landing pad area 111), some spacer dielectric 112 may extend over the gate contact landing pad area 111 as shown in FIG. 1K. However, the relative height of the gate contact landing pad area 111 can be designed to extend vertically further than shown in FIG. 1K such that etching, or planarizing, of the spacer dielectric 112 may expose it through, e.g., above, the spacer dielectric 112, e.g., to provide access to contact pad footprints 126 in the gate contact landing pad area 111 of the gate conductive layer 110. In this manner, the top of Fin structures 128, as well as source, drain, and gate contact pads can be fabricated to substantially the same height, i.e., a quasi-planar topography.

The above-described example embodiments of the present disclosure provide a quasi-planar topography, with source, drain and gate contact landing pad elevations being recessed relative to Fin structure elevation, thereby simplifying subsequent contact patterning. Furthermore, in one or more embodiments of the present disclosure, source/drain series resistance is reduced below that of previous approach Fin-MOSFET device configurations by locating the respective source and drain contact landing footprints, e.g., 126, as close as possible to a gate conductor. One having ordinary skill in the art will appreciate that high source/drain resistance tends to negate short-channel benefits.

According to one or more embodiments of the present disclosure, Fin-MOSFETs and Fin-JFETs are integrated together in a common fabrication process, e.g., having portions of Fin-JFETs and portions of Fin-MOSFETs being fabricated by the same fabricating process step. In integrating Fin-JFETs together with Fin-MOSFETs, Fin structures, e.g., the silicon layer 102 shown in FIG. 1B, are lightly doped using n-type dopants for nJFET and PMOS device configurations, and lightly doped using p-type dopants for pJFET and NMOS device configurations.

Figure 2A:
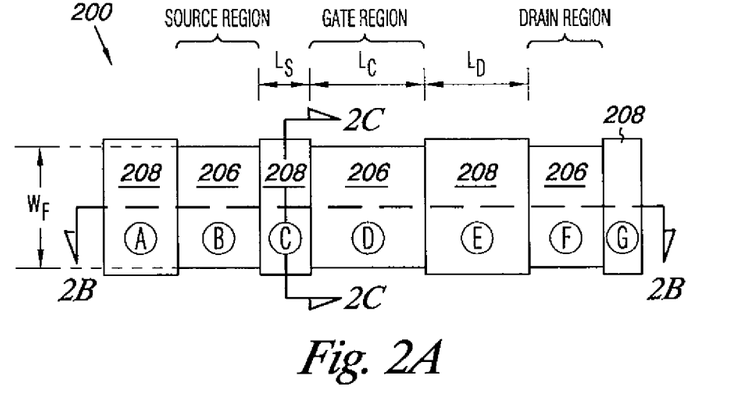
FIG. 2A illustrates a top view of a Fin-JFET structure at a particular point in a semiconductor fabrication process according to one or more embodiments of the present disclosure.
Figure 2B:
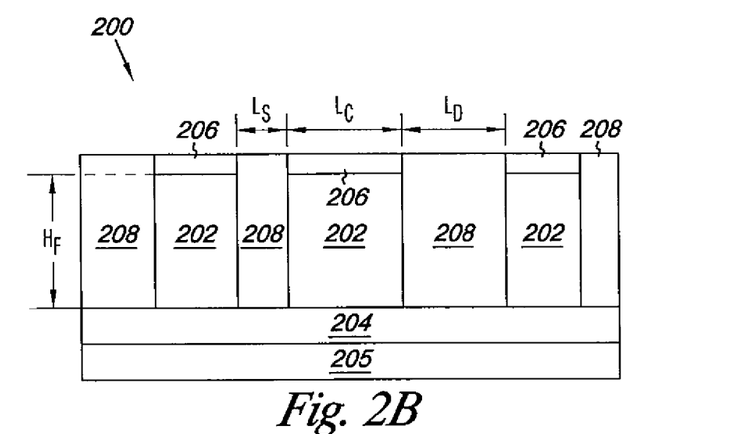
FIG. 2B illustrates a cross-sectional view of the Fin-JFET structure at the particular point in a semiconductor fabrication process illustrated in FIG. 2A, taken along cut line 2B-2B, according to one or more embodiments of the present disclosure.
Figure 2C:
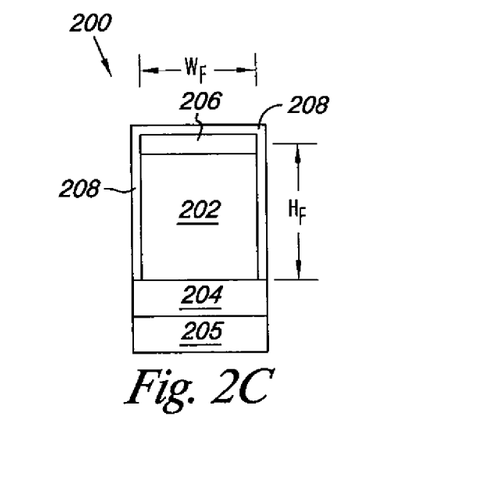
FIG. 2C illustrates a cross-sectional view of the Fin-JFET structure at the particular point in a semiconductor fabrication process illustrated in FIG. 2A, taken along cut line 2C-2C, according to one or more embodiments of the present disclosure.

FIGS. 2A-2C illustrate several views of a Fin-JFET structure portion of an integrated circuit 200 at a particular point in a semiconductor fabrication process according to one or more embodiments of the present disclosure. As mentioned above, the Fin-JFET being illustrated in FIGS. 2A-2C may be fabricated on the same substrate, concurrently with fabrication of other Fin-JFET devices, e.g., nJFET device and/or pJFET devices, and concurrently with fabrication of Fin-MOSFET devices, e.g., NMOS and/or PMOS devices such as those described in conjunction with FIGS. 1A-1L, using a common fabrication process step(s) to form portions of both type devices. However, the illustrations of FIGS. 2A-2C, as well as 2D-2F that follow, omit showing any other devices for clarity in illustrating Fin-JFET fabrication. FIG. 2A illustrates a top view of a JFET Fin structure, FIG. 2B illustrates a cross-sectional view taken along cut line 2B-2B, e.g., a side view through a JFET Fin structure, and FIG. 2C illustrates a cross-sectional view taken along cut line 2C-2C, e.g., and end view through a JFET Fin structure.

FIGS. 2A-2C illustrate an embodiment of a Fin-JFET structure 200 having a silicon (Si) layer 202, e.g., SOI layer, being formed over a base insulator layer 204, e.g., a base oxide (BOX). As shown in the embodiment of FIGS. 2A-2C, the Fin-JFET structure is separated from a semiconductor substrate 205, e.g. a bulk silicon wafer, by the base insulator layer 204. The silicon layer 202 and insulator layers 204 can be deposited or built-up on the respective underlying layer, e.g., thermally grown silicon dioxide. In one or more embodiments, the silicon layer 202 can be formed over the insulator layer 204 to a particular Fin height ($H_F$); however, embodiments of the present disclosure are not limited to particular dimensions. Where Fin-JFETs are to be integrated together on the same wafer with Fin-MOSFETs, the fins for Fin-JFETs and Fin-MOSFETs are formed out of the same silicon layer, e.g., silicon layer 102 in FIGS. 1B-1C and silicon layer 202 in FIGS. 2B-2C, the fin structures for the Fin-JFETs and Fin-MOSFETs can be fabricated to substantially the same height such that a quasi-planar topography is achieved for the Fin-FET devices.

According to one or more embodiments, a thick oxide (or other insulator) layer 206 is formed over the intended locations of Fin-JFET fins above the silicon layer 202. According to one or more embodiments, the Fin-JFET thick oxide layer 206 is formed to a thickness of about 1,000 Angstroms; however, Fin-JFET embodiments of the present disclosure are not so limited. In some embodiments, the thick oxide layer 206 can be silicon dioxide ($SiO_2$).

The thick insulator layer 206 is masked and etched, for example by using known photo-resist and photolithographic techniques, to pattern semiconductor Fins of a particular Fin width ($W_F$), length, and orientation. For example, a portion of the thick oxide layer 206 can be removed, leaving portions of the mask defining the Fin structures. As one skilled in the art will appreciate, portions of the silicon layer 202 not masked by the thick oxide layer 206 can be removed, e.g., by reactive ion etching (RIE), to form the Fin structures. In some embodiments, other lithography and etching techniques are used to form appropriate Fin structures, to be further processed into Fin-JFET as discussed below. According to one or more embodiments, one or more Fins for Fin-JFET devices are concurrently formed, e.g., masked, patterned and etched, by the same process steps used to form Fins for Fin-MOSFET devices. According to one or more embodiments, a single Fin-JFET structure is shown formed on the base insulator layer in FIGS. 2A-2F.

After Fins are formed from the silicon layer 202, a thin gate dielectric 208 of appropriate dielectric constant is grown or otherwise formed, e.g., by oxidation, over the Fin-JFET fin structure (and according to one or more embodiments, simultaneously over Fin-MOSFET fin structures, if any), including above and on silicon sidewall areas. Thus, formation of the gate dielectric layer 208 does not add much thickness to the top of the Fin-JFET Fin structure relative to the thickness of the thick oxide layer 206 thereon. The gate dielectric layer 208 is formed to a thickness which is much thinner than the thick oxide layer 206, and may be one or more orders of magnitude thinner than the dimension of the thick oxide layer 206 for example. One having ordinary skill in the art will appreciate that the gate dielectric layer 208 for Fin-JFET devices may be formed concurrently with, e.g., the same layer as, the gate dielectric 108 of Fin-MOSFET devices discussed previously.

By further patterning, the gate dielectric layer 208 is selectively removed from various places along the Fin-JFET fin structure sidewalls, e.g., at portions B, D and F as shown in FIG. 2A. In removing the dielectric layers from the sidewalls to expose the silicon layer 202 below, some or all of the gate dielectric layer 208 and/or thick oxide layer 206 may also be removed from the top of the fin. Thus, the gate dielectric layer 208 may remain and/or the thick oxide layer 206 above the silicon layer 202 may be exposed (FIG. 2A shows the gate dielectric layer 208 having been removed exposing the thick oxide layer 206 at portions B, D, and F). However, the process used to remove the gate dielectric layer 208 from the sidewalls does not appreciably affect the thick oxide layer 206 on top of the fin, which remains as is illustrated in FIGS. 2A and 2B. Methods to selectively remove the gate dielectric from the sidewalls are well-known, for example, photolithographic techniques, directional etching, etc. can be used. As will be appreciated by those having ordinary skill in the art, according to one or more embodiments having at least one Fin-JFET device and at least one Fin-MOSFET device being formed on a common substrate, the processing step(s) to remove the gate dielectric layer 208 from the sidewalls of portions of the Fin-JFET structure are additional to fabrication steps needed in forming a Fin-MOSFET structure. Thus Fin-JFETs can be fabricated on the same wafer as Fin-MOSFETs according to one or more embodiments of the present invention for a slight increase in the quantity of processing steps over that necessary to form a Fin-MOSFET.

Figure 2D:
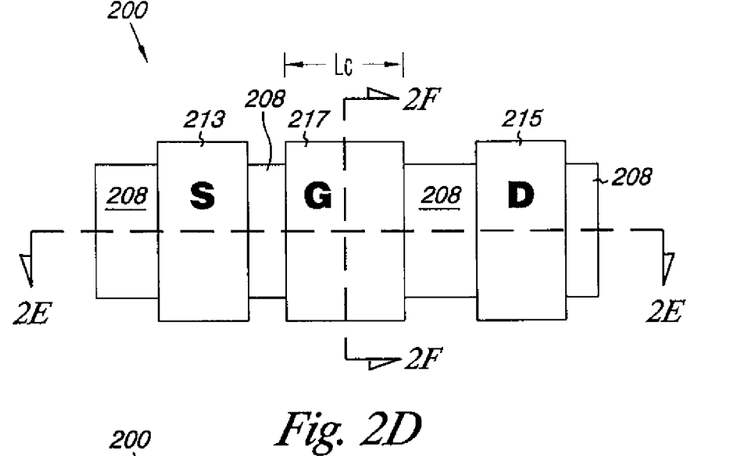
FIG. 2D illustrates a top view of a Fin-JFET structure at another particular point in a semiconductor fabrication process according to one or more embodiments of the present disclosure.
Figure 2E:
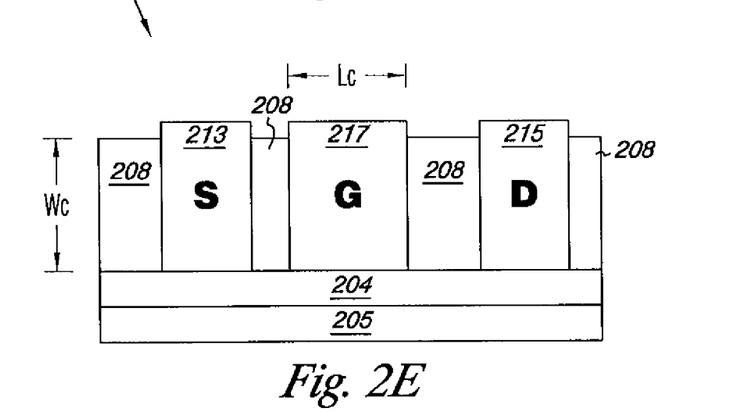
FIG. 2E illustrates a cross-sectional view of the Fin-JFET structure at the particular point in a semiconductor fabrication process illustrated in FIG. 2D, taken along cut line 2E-2E, according to one or more embodiments of the present disclosure.
Figure 2F:
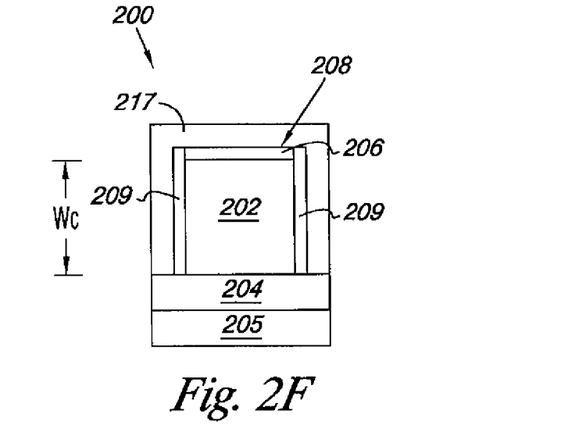
FIG. 2F illustrates a cross-sectional view of the Fin-JFET structure at the particular point in a semiconductor fabrication process illustrated in FIG. 2D, taken along cut line 2F-2F, according to one or more embodiments of the present disclosure.

FIGS. 2D-2F illustrate several views of a Fin-JFET structure portion of an integrated circuit 200 at another particular point in a semiconductor fabrication process according to one or more embodiments of the present disclosure. FIG. 2D illustrates a top view, FIG. 2E illustrates a cross-sectional view taken along cut line 2E-2E, e.g., a side view through a JFET Fin structure, and FIG. 2F illustrates a cross-sectional view taken along cut line 2F-2F, e.g., an end view through a JFET Fin structure. Please note cut line 2F-2F in FIG. 2D is at a different location than cut line 2C-2C shown in FIG. 2A in order to illustrate different features. FIG. 2F illustrates a slice through the channel below the Fin-JFET gate, the channel length extending perpendicular to the plane of the drawing sheet from the drain (under the plane of the drawing sheet) to the source (above the plane of the drawing sheet).

JFET gate junction length determines the channel length ($L_C$ in FIGS. 2A/B and 2D/E), and channel width (We in FIGS. 2E and 2F). Fin width ($W_F$) of the JFET Fin structure is sometimes also referred to as the thickness of the Fin structure, as shown in FIGS. 2A and 2C. The JFET Fin width ($W_F$) is generally larger than the width (i.e., thickness) of a MOSFET Fin, e.g., W in FIGS. 1A and 1B. For example in forming at least one Fin-JFET and at least one Fin-MOSFET on a common substrate, a Fin structure associated with at least one Fin-JFET can be formed to a greater width than a Fin structure associated with the at least one Fin-MOSFET. According to one or more particular embodiments of the present disclosure, Fin-JFET width ($W_F$) is approximately 100 nm; however, embodiments are not limited to this dimension. Multiple Fins can be used, e.g., in parallel, to accommodate a given drive current. The additional JFET Fin width (i.e., thickness), with respect to the MOSFET Fin width (i.e., thickness) is determined by the desired operating characteristics of a particular JFET, its threshold voltage and channel dopant concentration.

According to one or more embodiments of the present disclosure, the magnitude of threshold voltage is in a range of minus 1.2 Volts (−1.2 V) to minus 1.5 Volts (−1.5 V), and defined by a turn-off condition having the depletion regions induced by the double-junction gate merge at the source. The channel length, e.g., $L_C$ shown in FIGS. 2A and 2B, distance between the drain and gate, e.g., $L_D$ shown in FIGS. 2A and 2B, and distance between the source and gate, e.g., $L_S$ shown in FIGS. 2A and 2B, can be adjusted to the required applied voltage and device linearity desired. Fin-JFETs of various dimensions may be fabricated on a common substrate, e.g., embodiments are not limited to any particular dimensions or to one particular set of dimensions. According to one or more embodiments, a first number of semiconductor fins are formed on a substrate to a first set of dimensions, and a second number of semiconductor fins are formed on the substrate to a second set of dimensions. The first and second sets of dimensions have at least different drain-to-gate and source-to-gate spacing so as to achieve different Fin-JFET operating characteristics, e.g., operating voltages and linearity. According to one or more embodiments of the present invention, the fins are formed having similar height dimensions to provide a quasi-planar topography. Unlike MOSFET devices, with appropriate choice of dimensions, JFET devices can sustain voltages as high as 30-50 Volts, thus suggesting relatively more channel volume as compared to MOSFET devices.

As described above, portions of the silicon layer 202 are exposed along the sidewall of the Fin-JFET structure, e.g., portions B, D and F as shown in FIG. 2B, by removing the gate dielectric 208 layer from the sidewalls. The portions B, D, and F are where the source, drain and gate regions of the Fin-JFET are formed respectively, with the silicon layer 202 being exposed prior to polysilicon ("POLY") deposition. The thick oxide 206 and gate dielectric 208 remain on other portions of the Fin-JFET structure, including portions A and G at the respective ends, portion C of length $L_S$ between the source and gate regions, and portion E of length $L_D$ between the gate and drain regions. Removing the gate dielectric layer 208 along the sidewalls of the Fin-JFET structure within portion D uncovers the silicon channel in the gate region, having a length $L_C$.

In-situ doped n-type polysilicon, e.g., SiGe POLY, is concurrently formed, e.g., deposited and patterned over exposed source/drain regions of nJFET device(s), over exposed gate regions of pJFET device(s), and as the n-type POLY gate(s) of NMOS device(s). The POLY is deposited so as to be in contact with the exposed silicon along the sidewalls and above any remaining thick oxide layer 206 (and gate dielectric layer 208, if any) on top of the Fin-JFET fin structure. Likewise, in-situ doped p-type POLY is concurrently formed, e.g., deposited and patterned, over exposed source/drain regions of a pJFET device(s), over exposed gate(s) of nJFET device(s), and as the p-type POLY gate(s) of a PMOS device(s).

As shown in FIG. 2F, a gate conductive layer 217, e.g., POLY, is placed in direct contact with the silicon layer 202 along portions of the Fin structure sidewalls. Subsequent heat cycles drive the POLY dopant from the POLY into the adjacent silicon forming side diffused junction regions 209, e.g., a gate junction for the JFET devices. The reader will appreciate, and as shown in FIG. 2E, that an nJFET will then have for example, an n-type polysilicon source conductive layer, e.g., 213, an n-type polysilicon drain conductive layer, e.g., 215, and a p-type polysilicon junction-gate conductive layer, e.g., 217, formed over an n-type semiconductor, e.g., 202. Conversely, a pJFET will have for example, a p-type polysilicon source conductive layer, e.g., 213, a p-type polysilicon drain conductive layer, e.g., 215, and an n-type polysilicon junction-gate conductive layer, e.g., 217, formed over p-type semiconductor. The appropriately-doped polysilicon in contact with silicon 202 of JFET structures, form the appropriate junctions between source, drain, and gate junctions, e.g., diffused regions 209 shown in FIG. 2F.

The Fin-JFET channel length ($L_C$) and channel width ($W_C$) are shown as indicated in FIGS. 2D-2F. As shown in FIGS. 2E and 2F, the channel is located along the sidewall(s) of the silicon Fin structure, with the channel width ($W_C$) corresponding to the Fin structure height ($H_F$). However, embodiments of the present invention are not so limited. One having ordinary skill in the art will appreciate the processing steps for removing the thick oxide 206 and forming a channel on top of the Fin structure as well.

One skilled in the art will recognize that semiconductor Fin structures can be formed concurrently for Fin-MOSFETs and Fin-JFETs located on the same wafer, e.g., by the same fabrication process step. In addition, one skilled in the art will appreciate that a number of nJFETs, pJFETS, NMOS, and PMOS devices can be fabricated according to a CMOS technology, i.e., having devices formed with n-type semiconductor doping and devices formed with p-type semiconductor doping on a common substrate, by common fabrication processes. Thus, according to embodiments of the present disclosure concerning fabrication of at least one Fin-MOSFET on a substrate and at least one Fin-JFET on the substrate, n-type semiconductor for PMOS and nJFET devices can be doped together at substantially the same time, e.g., by the same fabrication process step, and p-type semiconductor for NMOS and pJFET devices can be doped together concurrently, e.g., by another same fabrication process step.

According to one or more embodiments of the present disclosure, Fin-MOSFETs and Fin-JFETs are integrated together on the same die and formed by a common fabrication process. For example, the semiconductor layer can be formed at the same time for Fin-MOSFETs and Fin-JFETs; and Fin structures, e.g., pillars, for Fin-MOSFETs and Fin-JFETs can be concurrently patterned and formed from the same semiconductor layer by common processing step(s). Thereafter, n-type semiconductor Fin structures of Fin-MOSFETs (e.g., Fin-pMOSFETs) and Fin-JFETs (e.g., Fin-nJFETs) can be doped concurrently, and p-type semiconductor Fin structures of Fin-MOSFETs (e.g., Fin-nMOSFETs) and Fin-JFETs (e.g., Fin-pJFETs) can be doped concurrently at another step. One or more dielectric layer(s) can be formed concurrently over Fin-JFET and Fin-MOSFET structures, as previously described. Further forming and doping of respective source, drain, and gate regions for the integrated Fin-JFETs and Fin-MOSFETs may also be concurrently accomplished for similarly-doped regions of different type FET devices, as previously discussed. N-type POLY can be concurrently applied in forming the gate of NMOS devices, and in forming the n-portion of the pn junction of pJFET devices. P-type POLY can be concurrently applied in forming the gate of PMOS devices, and in forming the p-portion of the pn junction of nJFET devices.

Figure 3:
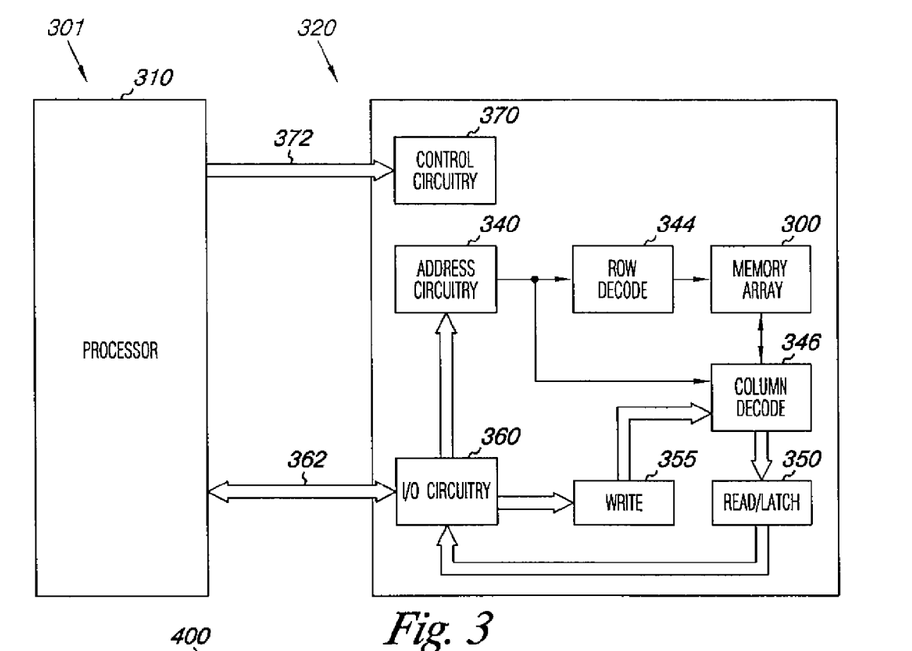
FIG. 3 is a functional block diagram of a memory system with a memory device which includes one or more integrated circuits having at least one Fin-HET and at least one Fin-MOSFET formed on a common substrate in accordance with one or more embodiments of the present disclosure.

FIG. 3 illustrates a memory system 301 includes a processor 310 and is coupled to a memory device 320 that includes an array of memory cells 300, e.g., a memory array. The memory device 320 includes one or more embodiments of the present disclosure, e.g., an integrated circuit having at least one Fin-JFET and at least one Fin-MOSFET formed on a common substrate according to a CMOS process. The memory system 301 can include separate integrated circuits or both the processor 310 and the memory device 320 can be on the same integrated circuit. The processor 310 can be a microprocessor or some other type of controlling circuitry such as an application-specific integrated circuit (ASIC).

For clarity, the electronic memory system 301 has been simplified to focus on features with particular relevance to the present disclosure. The memory device 320 includes an array of memory cells 300. As will be appreciated by those of ordinary skill in the art, the manner of connection of the memory cells to the sense lines and source lines depends on whether the array is a NAND architecture, a NOR architecture, and AND architecture, or some other memory array architecture.

The embodiment of FIG. 3 includes address circuitry 340 to latch address signals provided over I/O connections 362 through I/O circuitry 360. Address signals are received and decoded by a row decoder 344 and a column decoder 346 to access the memory array 300. In light of the present disclosure, it will be appreciated by those skilled in the art that the number of address input connections depends on the density and architecture of the memory array 300 and that the number of addresses increases with both increased numbers of memory cells and increased numbers of memory blocks and arrays.

The array of memory cells 300 includes cells that can utilize operating voltages associated with programming. The memory device 320 reads data in the memory array 300 by sensing voltage and/or current changes in the memory array columns using sense/buffer circuitry that in this embodiment can be read/latch circuitry 350. The read/latch circuitry 350 can be coupled to read and latch a row of data from the memory array 300. I/O circuitry 360 is included for bi-directional data communication over the I/O connections 362 with the processor 310. Write circuitry 355 is included to write data to the memory array 300.

Control circuitry 370 decodes signals provided by control connections 372 from the processor 310. These signals can include chip signals, write enable signals, and address latch signals that are used to control the operations on the memory array 300, including read, write, heal, and erase operations. In various embodiments, the control circuitry 370 is responsible for executing instructions from the processor 310 to perform the operating and programming embodiments of the present disclosure. The control circuitry 370 can be a state machine, a sequencer, or some other type of controller. It will be appreciated by those skilled in the art that additional circuitry and control signals can be provided, and that the memory device detail of FIG. 3 has been reduced to facilitate ease of illustration. Certain components of the memory system 301 may process analog signals, for example, an analog signal may be manipulated and subsequently digitized with the digital values being stored in the memory array. Furthermore, memory system 301 may be implemented as part of a system on a chip.

Figure 4:
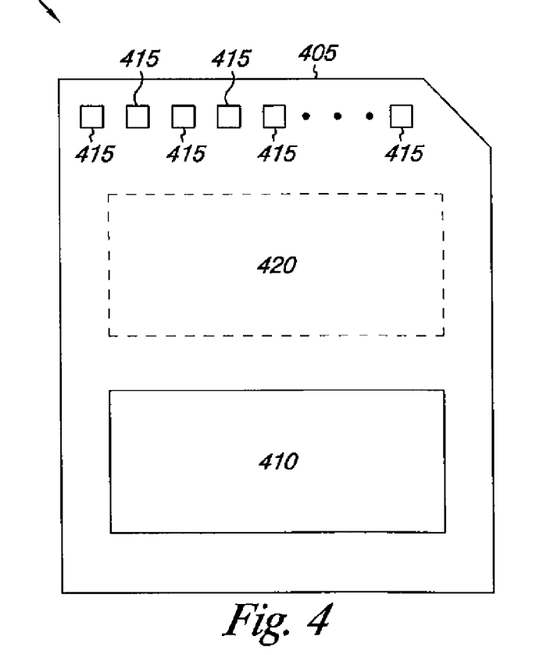
FIG. 4 is a functional block diagram of a memory module with a memory device which includes one or more integrated circuits having at least one Fin-JFET and at least one Fin-MOSFET formed on a common substrate in accordance with one or more embodiments of the present disclosure.

FIG. 4 is a functional block diagram of a memory module with a memory device which includes one or more integrated circuits having at least one Fin-JFET and at least one Fin-MOSFET formed on a common substrate in accordance with one or more embodiments of the present disclosure. FIG. 4 illustrates memory module 400 as a memory card, although the concepts discussed with reference to memory module 400 are applicable to other types of removable or portable memory, e.g., USB flash drives, and are intended to be within the scope of "memory module" as used herein. Memory module 400 may, for example, be implemented as part of a system on a chip.

In some embodiments, memory module 400 will include a housing 405 (as depicted) to enclose one or more memory devices 420, though such a housing is not essential to all devices or device applications. At least one memory device 420 includes an array of memory cells including one or more embodiments of the present disclosure, e.g., integrated Fin-MOSFETs and Fin-JFETs. Where present, the housing 405 includes one or more contacts 415 for communication with a host device. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. In general, however, contacts 415 provide an interface for passing control, address and/or data signals between the memory module 400 and a host having compatible receptors for the contacts 415.

The memory module 400 may optionally include additional circuitry 410, which may be one or more integrated circuits and/or discrete components. For some embodiments, the additional circuitry 410 may include a memory controller for controlling access across multiple memory devices 420 and/or for providing a translation layer between an external host and a memory device 420. For example, there may not be a one-to-one correspondence between the number of contacts 415 and a number of connections to the one or more memory devices 420. Thus, a memory controller could selectively couple an I/O connection of a memory device 420 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 420. A memory controller could then translate the command sequences received from a host into the appropriate command sequences to achieve the desired access to the memory device 420. Such translation may further include changes in signal voltage levels in addition to command sequences.

The additional circuitry 410 may further include functionality unrelated to control of a memory device 420 such as logic functions as might be performed by an ASIC. Also, the additional circuitry 410 may include circuitry to restrict read or write access to the memory module 400, such as password protection, biometrics or the like. The additional circuitry 410 may include circuitry to indicate a status of the memory module 400. For example, the additional circuitry 410 may include functionality to determine whether power is being supplied to the memory module 400 and whether the memory module 400 is currently being accessed, and to display an indication of its status, such as a solid light while powered and a flashing light while being accessed. The additional circuitry 410 may further include passive devices, such as decoupling capacitors to help regulate power requirements within the memory module 400.

Figure 5:
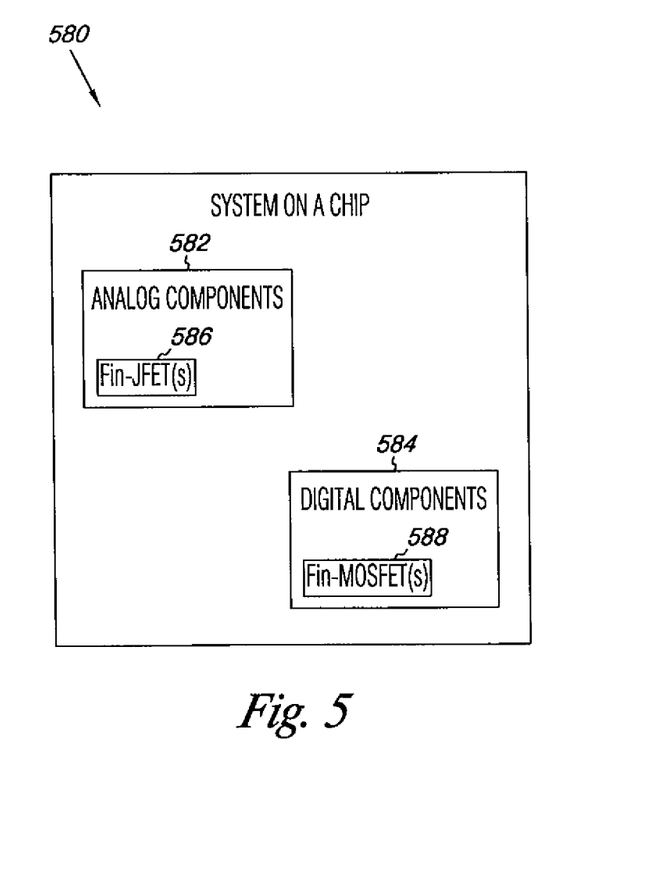
FIG. 5 is a functional block diagram of a system on a chip having at least one Fin-JFET and at least one Fin-MOSFET formed on a common substrate in accordance with one or more embodiments of the present disclosure.

FIG. 5 is a functional block diagram of a system on a chip 580 having at least one Fin-JFET and at least one Fin-MOSFET formed on a common substrate in accordance with one or more embodiments of the present disclosure. According to one or more embodiments, the system on a chip 580 includes at least one analog component 582 and at least one digital circuit component 584. The analog component(s) 582 include one or more Fin-JFET(s) 586, and the digital component(s) 584 include one or more Fin-MOSFET(s) 588, with the Fin-JFET(s) 586 and the Fin-MOSFET(s) 588 being formed on a common substrate according to a CMOS process. According to one or more embodiments, the digital component(s) 584 include a processor coupled to a memory device having an array of memory cells, such as the memory system 301 illustrated in FIG. 3 and described above; however, embodiments of the present invention are not so limited. The analog components 582 may include, for example, amplifiers, wave-shaping circuitry, and other signal processing circuits and elements.

CONCLUSION

Methods, devices, and systems integrating Fin-JFETs and Fin-MOSFETs are provided. One method embodiment includes forming at least on Fin-MOSFET on a substrate and forming at least on Fin-JFET on the substrate.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An integrated circuit, comprising:
a number of Fin-MOSFETs formed on a substrate; and
a number of Fin-JFETs formed on the substrate;
wherein a Fin structure associated with the number of Fin-JFETs has a width different than a width of a Fin structure associated with the number of Fin-MOSFETs.

2. The integrated circuit of claim 1, wherein the number of Fin-JFETs includes a number of nJFET devices and a number of pJFET devices having Fin structures formed according to a CMOS process.

3. The integrated circuit of claim 1, wherein the Fin structure associated with at least one of the number of Fin-JFETs has a greater width than the Fin structure associated with at least one of the number of Fin-MOSFETs.

4. The integrated circuit of claim 1, wherein the number of Fin-MOSFETs includes a number of NMOS FETs and a number of PMOS FETs having Fin structures formed according to a CMOS process.

5. The integrated circuit of claim 1, including:
a dielectric material extending over the Fin structure associated with the number of Fin-JFET Fins and the Fin structure associated with the number of Fin-MOSFET Fins; and
a first conductive material extending over the Fin structures associated with the number of Fin-JFETs and the number of Fin-MOSFETs.

6. The integrated circuit of claim 5, including a second conductive material that forms at least one Fin-JFET terminal, wherein the second conductive material is doped differently than the first conductive material.

7. The integrated circuit of claim 1, wherein the number of Fin-MOSFETs and the number of Fin-JFETs have a quasi-planar topography.

8. An integrated circuit, comprising:
at least one semiconductor Fin structure formed on a substrate;
a dielectric material formed over the at least one Fin structure, wherein portions of the dielectric material associated with a source, gate, and drain region of the Fin structure are selectively removed;
a first conductive material formed over the source and the drain regions; and
a second conductive material formed over the gate region;
wherein the second conductive material has a different type doping than the first conductive material.

9. The integrated circuit of claim 8, wherein the integrated circuit is a Fin-JFET device.

10. The integrated circuit of claim 9, wherein the at least one semiconductor Fin structure includes:
a first number of semiconductor fins formed to a first set of dimensions; and
a second number of semiconductor fins formed to a second set of dimensions.

11. The integrated circuit of claim 10, wherein the first and second sets of dimensions have at least different drain-to-gate and source-to-gate spacing so as to achieve different Fin-JFET operating voltages and linearity.

12. An integrated circuit, comprising:
at least one Fin-JFET on a substrate;
at least one Fin-MOSFET on the substrate; and
wherein fin structures for the at least one Fin-JFET and the at least one Fin-MOSFET are formed to substantially a same height out of a same semiconductor layer, and
wherein a Fin structure associated with the at least one Fin-JFET has a width different than a width of a Fin structure associated with the at least one Fin-MOSFET.

13. The integrated circuit of claim 12, wherein the quasi-planar topography includes:
a gate conductive material contact landing pad recessed to a height not exceeding a source and drain height; and
areas between semiconductor structures filled with spacer dielectric material.

14. The integrated circuit of claim 12, wherein:
Fin-MOSFET source and drain extensions are formed on a semiconductor Fin surface located furthest away from the substrate and adjacent to a gate dielectric material so as to reduce series resistance.

15. The integrated circuit of claim 14, including source and drain contacts formed on the semiconductor Fin surface located furthest away from the substrate.

16. The integrated circuit of claim 12, wherein the integrated circuit includes an analog circuit component including the at least one Fin-JFET.

17. The integrated circuit of claim 16, wherein the integrated circuit includes a digital component including the at least one Fin-MOSFET.

18. The integrated circuit of claim 12, wherein the at least one Fin-JFET and the at least one Fin-MOSFET are formed according to a CMOS process.

19. The integrated circuit of claim 12, wherein the integrated circuit is a system on a chip.

* * * * *

UNITED STATES PATENT AND TRADEMARK OFFICE
CERTIFICATE OF CORRECTION

PATENT NO.       : 8,502,280 B2
APPLICATION NO.  : 13/086246
DATED            : August 6, 2013
INVENTOR(S)      : Badih El-Kareh et al.

It is certified that error appears in the above-identified patent and that said Letters Patent is hereby corrected as shown below:

In the Claims

In column 17, lines 62-63, in Claim 5, delete "Fin-MOSFET Fins;" and insert
-- Fin-MOSFETs; --, therefor.

Signed and Sealed this
Twenty-ninth Day of October, 2013

Teresa Stanek Rea
*Deputy Director of the United States Patent and Trademark Office*